(12) United States Patent
Lee et al.

(10) Patent No.: US 7,474,142 B2
(45) Date of Patent: *Jan. 6, 2009

(54) INTERNAL VOLTAGE GENERATING CIRCUIT

(75) Inventors: Kang-Seol Lee, Ichon-shi (KR); Jae-Hyuk Im, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/905,530

(22) Filed: Oct. 2, 2007

(65) Prior Publication Data

US 2008/0024203 A1 Jan. 31, 2008

Related U.S. Application Data

(63) Continuation of application No. 11/302,375, filed on Dec. 14, 2005, now Pat. No. 7,292,090.

(30) Foreign Application Priority Data

Apr. 30, 2005 (KR) ...................... 10-2005-0036549

(51) Int. Cl.
G05F 1/10 (2006.01)
(52) U.S. Cl. ..................................... 327/536
(58) Field of Classification Search ............... 327/535, 327/536, 537
See application file for complete search history.

(56) References Cited

U.S. PATENT DOCUMENTS

| | | | |
|---|---|---|---|
| 5,493,234 A | 2/1996 | Oh | |
| 6,097,428 A | 8/2000 | Wu et al. | |
| 6,150,860 A | 11/2000 | Chun | |
| 6,181,119 B1 | 1/2001 | Ikeda et al. | |
| 6,297,624 B1 | 10/2001 | Mitsui et al. | |
| 6,333,873 B1 | 12/2001 | Kumanoya et al. | |
| 6,373,322 B2 | 4/2002 | Kobayashi et al. | |
| 6,522,193 B2 | 2/2003 | Shin | |
| 6,724,242 B2 | 4/2004 | Kim et al. | |
| 6,762,640 B2 | 7/2004 | Katsuhisa | |

(Continued)

FOREIGN PATENT DOCUMENTS

JP 10-125097 5/1998

(Continued)

OTHER PUBLICATIONS

U.S. Appl. No. 11/320,852, filed Dec. 30, 2005, Lee et al.

(Continued)

*Primary Examiner*—Jeffrey S Zweizig
(74) *Attorney, Agent, or Firm*—McDermott Will & Emery LLP

(57) ABSTRACT

There is an internal voltage generating circuit for providing a stable internal voltage by supplying the internal voltage before a time point when it is used. The internal voltage generating circuit includes a charge pump unit for generating an internal voltage lower than an external voltage in response to pumping control signals and a supply driving control signal; a pumping control signal generating unit for outputting the pumping control signals to the charge pump unit based on a driving signal; and a supply driving control unit for receiving the driving signal to generate the supply driving control signal to the charge pump unit.

18 Claims, 9 Drawing Sheets

U.S. PATENT DOCUMENTS

| | | |
|---|---|---|
| 6,842,382 B2 | 1/2005 | Kim et al. |
| 6,861,872 B2 | 3/2005 | Suh |
| 2004/0017247 A1 | 1/2004 | Yasui et al. |
| 2004/0155701 A1 | 8/2004 | Kim et al. |
| 2004/0232957 A1 | 11/2004 | Do |
| 2006/0145747 A1 | 7/2006 | Ucciardello et al. |
| 2006/0244515 A1 | 11/2006 | Lee et al. |
| 2006/0244517 A1 | 11/2006 | Lee et al. |

FOREIGN PATENT DOCUMENTS

| | | |
|---|---|---|
| JP | 2003-85977 | 1/2003 |
| KR | 2002-0007439 | 1/2002 |
| KR | 10-2002-84892 | 11/2002 |
| KR | 10-2004-102610 | 12/2004 |

OTHER PUBLICATIONS

United States Office Action issued in U.S. Appl. No. 11/320,852, mailed on Feb. 14, 2008.

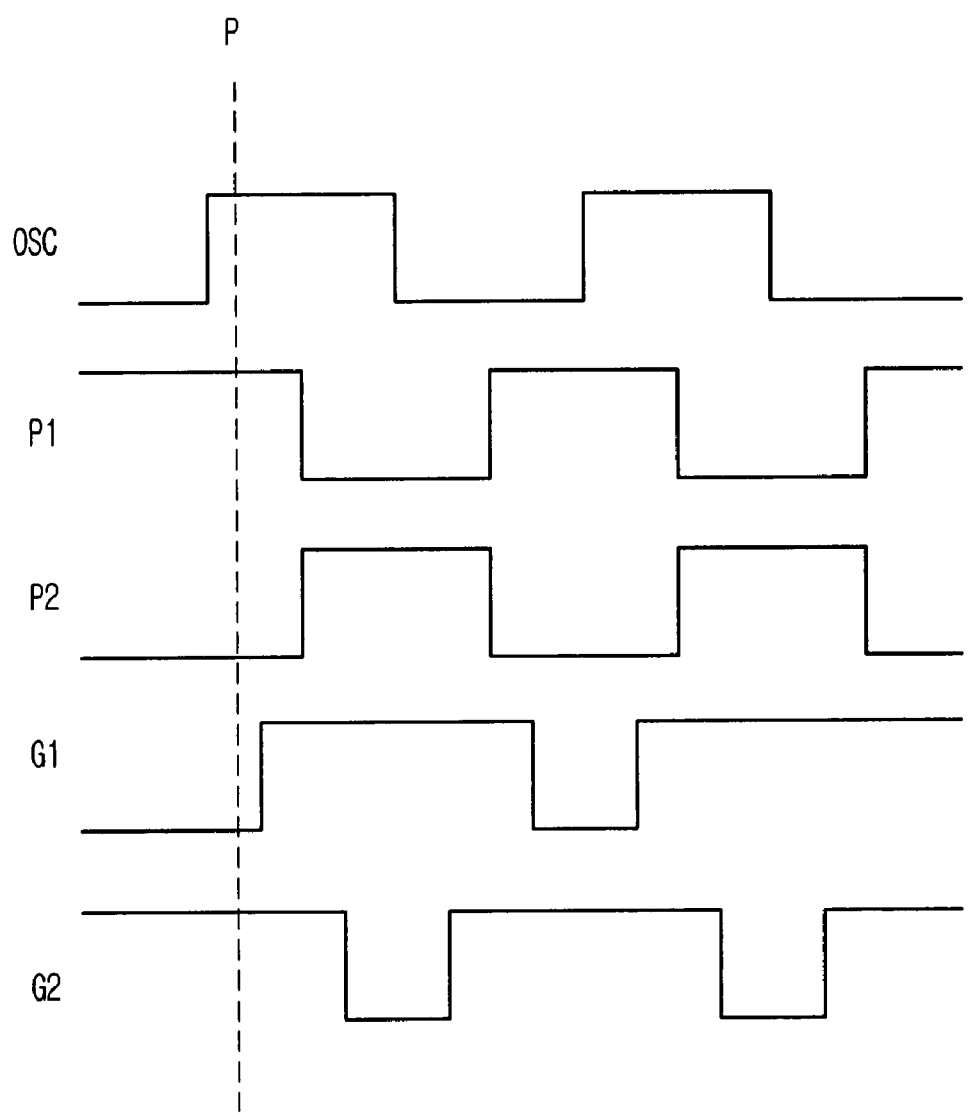

INTERNAL VOLTAGE GENERATING CIRCUIT

RELATED APPLICATIONS

This application is a Continuation of U.S. application Ser. No. 11/302,375, filed Dec. 14, 2005, now U.S. Pat. No. 7,292,090 claiming priority of Korean Application No. 10-2005-0036549, filed Apr. 30, 2005, the entire contents of each of which are hereby incorporated by reference.

FIELD OF THE INVENTION

The present invention relates to a semiconductor design technology; and, more particularly, to an internal voltage generating circuit for maintaining a stable internal voltage level because of a fast response time.

DESCRIPTION OF RELATED ART

In semiconductor memory devices, an internal voltage generating circuit receives an external voltage VDD to generate various levels of an internal voltage.

With low voltage and low power consumption of the semiconductor memory devices, internal voltage generating circuits are increasingly employed in DRAMs.

Meanwhile, since the voltages used in the semiconductor memory devices are internally generated, many attempts have been made to generate stable internal voltages regardless of ambient temperature, process, or pressure.

FIG. 1 is a block diagram of a conventional internal voltage generating circuit.

Referring to FIG. 1, the conventional internal voltage generating circuit includes a level detector 10, an oscillator 20, a pumping control signal generator 30, and a charge pump 40.

The charge pump 40 negatively pumps an external voltage VDD to generate an internal voltage VBB lower than the external voltage VDD. The level detector 10 detects a level increase of the internal voltage VBB. The oscillator 20 generates a periodic signal OSC in response to a detection signal BBE of the level detector 10. The pumping control signal generator 30 controls a driving of the charge pump 40 in response to the periodic signal OSC.

In such an internal voltage generating circuit, when the level of the internal voltage VBB increases, its level increase is detected through the level detector 10 and then the charge pump 40 is driven by the pumping control signal generator 30. Therefore, the internal voltage VBB is maintained to a constant level.

The charge pump 40 may be configured with a doubler-type charge pump.

FIG. 2 is a circuit diagram of the level detector 10 shown in FIG. 1.

Referring to FIG. 2, the level detector 10 includes a voltage divider 12, an inverter I1, an inverter I2, and a differential amplifier 14, and an inverter I3.

The voltage divider 12 is configured with serially connected resistors and divides a level difference between a reference voltage VBB_high and the internal voltage VBB. The inverter I1 receives the reference voltage VBB_high and a ground voltage VSS as a driving voltage, and inverts an output voltage of the voltage divider 12. The inverter I2 receives the reference voltage VBB_high and the ground voltage VSS as a driving voltage, and inverts an output voltage A of the inverter I1. The differential amplifier 14 amplifiers a level difference between the output voltages A and B of the inverters I1 and I2. The inverter I3 receives the external voltage VDD and the ground voltage VSS as a driving voltage, and outputs an output voltage of the differential amplifier 14 as the detection signal BBE.

When the internal voltage VBB increases higher than the reference voltage (VBB_high) level, the inverter I1 outputs the ground voltage VSS level as the output voltage A. Then, the inverter I2 outputs the VSS_high level voltage as the output voltage B. The differential amplifier 14 differentially receives the output voltages A and B of the inverters I1 and I2 to output the VSS level voltage. Therefore, the inverter I3 inverts the output voltage of the differential amplifier 14 to output the external voltage VDD level, that is, a logic high level.

On the contrary, when the internal voltage VBB maintains the VBB_high level, the inverter I1 outputs the VBB_high level and the inverter I2 outputs the VSS level. Therefore, the differential amplifier 14 outputs the VDD level and finally the inverter I3 outputs the VSS level, that is, a logic low level.

FIG. 3 is a circuit diagram of the oscillator 20 shown in FIG. 1. The oscillator 20 includes a first inverter chain 22, a NAND gate ND1, and a second inverter chain 24.

The first inverter chain 22 delays and inverts the periodic signal OSC to generate a feedback periodic signal. The NAND gate ND1 receives the feedback periodic signal and the detection signal BBE. The second inverter chain 24 delays and inverts an output signal of the NAND gate ND1 to generate the periodic signal OSC.

The oscillator 20 is controlled by the detection signal BBE to generate the periodic signal OSC. That is, when the detection signal BBE is a logic high level, the oscillator 20 generates the periodic signal OSC that is toggled at a constant period. On the contrary, when the detection signal BBE is a logic low level, the oscillator 20 generates a logic low level signal as the periodic signal OSC.

FIG. 4A is a circuit diagram of the pumping control signal generator 30 shown in FIG. 1.

Referring to FIG. 4A, the pumping control signal generator 30 includes first to third delay units 32, 34 and 36 and a signal generating unit 38.

The first to third delay units 32, 34 and 36 are connected in series to output first to third delay periodic signals T1, T2 and T3. That is, the first delay unit 32 receives the periodic signal OSC to output the first delay periodic signal T1, and the second delay unit 34 delays an output of the first delay unit 32 to output the second delay periodic signal T2. Also, the third delay unit 36 delays an output of the second delay unit 34 to output the third delay periodic signal T3. The signal generating unit 38 receives the first to third delay periodic signals T1, T2 and T3 to output a plurality of pumping control signals P1, P2, G1 and G2.

FIG. 4B is an operational waveform of the pumping control signal generator shown in FIG. 4A.

Referring to FIG. 4B, the pumping control signal generator 30 generates the pumping control signal P2 by delaying the periodic signal OSC by a predetermined time, the pumping control signal P1 having an opposite phase to the pumping control signal P2, the pumping control signal G1 containing an activation period of the pumping control signal P2, and the pumping control signal G2 having a phase difference of 90° with respect to the pumping control signal G1.

The waveform of FIG. 4B shows the operation of the pumping control signal generator 30 when the level of the internal voltage VBB increases higher than the reference voltage VBB_high, the detection signal BBE of the level detector 10 is activated to a logic high level, and the oscillator 20 generates the periodic signal OSC.

FIG. 5 is a circuit diagram of the charge pump 40 shown in FIG. 1.

In the charge pump 40 shown in FIG. 5, a capacitor C1 has one terminal receiving the pumping control signal P1 and the other terminal connected to a node P1_BT, and a capacitor C3 has one terminal receiving the pumping control signal P2 and the other terminal connected to a node P2_BT. An NMOS transistor NM2 has a gate receiving a voltage of the node P1_BT and a drain-source path between the internal voltage VBB and the node P2_BT, and an NMOS transistor NM1 has a gate receiving a voltage of the node P2_BT and a drain-source path between the internal voltage VBB and the node P1_BT. A capacitor C2 has one terminal receiving the pumping control signal G2 and the other terminal connected to a node G1_BT, and a capacitor C4 has one terminal receiving the pumping control signal G2 and the other terminal connected to a node G2_BT. A PMOS transistor PM1 has a gate receiving a voltage of the node G1_BT and a source-drain path between the node P1_BT and a ground voltage VSS supply, and a PMOS transistor PM4 has a gate receiving a voltage of the node G2_BT and a source-drain path between the node P2_BT and the VSS supply. A PMOS transistor PM2 has a source connected to the node G1_BT, and a drain and a gate commonly connected to the drain of the PMOS transistor PM1. A PMOS transistor PM3 has a source and a gate commonly connected to the node G1_BT, and a drain connected to the drain of the PMOS transistor PM1. A PMOS transistor PM6 has a source connected to the node G2_BT, and a drain and a gate commonly connected to the drain of the PMOS transistor PM4. A PMOS transistor PM5 has a source and a gate commonly connected to the node G2_BT, and a drain connected to the drain of the PMOS transistor PM4.

The operation of the charge pump 40 receiving the pumping control signals P1, P2, G1 and G2 will be described with reference to a time point 'P' in FIG. 4B.

First, the pumping control signals P1, G1 and G2 have a logic high level, a logic low level, and a logic high level, respectively.

Since the node G1_BT is set to the VSS level due to the pumping control signal G1, the PMOS transistor PM1 is turned on in response to the pumping control signal G1, so that the node P1_BT is also set to the VSS level.

In addition, the node G2_BT is set to the external voltage VDD level due to the pumping control signal G2.

Then, the pumping control signal G1 changes to a logic high level, so that the node G1_BT increases to the VDD level. Therefore, the PMOS transistor PM1 is turned on so that the node P1_BT is opened from the VSS supply.

Next, the pumping control signal P1 changes to a logic low level, so that the node P1_BT is set to −VDD level by the capacitor C1 of which one terminal receives the pumping control signal P1. The pumping control signal P2 changes to a logic high level, so that the node P2_BT is se to the VDD level by the capacitor C3 of which one terminal receives the pumping control signal P2.

Accordingly, the NMOS transistor NM1 is turned on in response to the voltage of the node P2_BT so that −VDD level applied to the node P1_BT is outputted as the internal voltage VBB.

Then, the pumping control signal G2 changes to a logic low level, so that the node P2_BT is precharged to the VSS level by the PMOS transistor PM4 of which gate receives the voltage of the node G2_BT.

The pumping control signal G2 again changes to a logic high level. Therefore, the PMOS transistor PM4 is turned off so that the node P2_BT is opened from the VSS supply.

Thereafter, the pumping control signal P1 changes to a logic high level and the node P1_BT increases up to the VDD level. The pumping control signal P2 changes to a logic low level, so that the node P2_BT decreases up to −VDD level.

Accordingly, the NMOS transistor NM2 is turned on in response to the voltage of the node P1_BT, so that −VDD voltage level applied to the node P2_BT is outputted as the internal voltage VBB.

Meanwhile, the problem that the conventional internal voltage generating circuit cannot stably maintain the internal voltage VBB will be described below with reference to FIG. 6.

Referring to FIG. 6, a large amount of a high voltage is dissipated in a memory region at a time point when a word line WL is activated and deactivated by an active command ACT and a precharge command PCG.

When the VBB level increases higher than the VBB_high level, the conventional internal voltage generating circuit detects the increased VBB level to increase a supply of the VBB voltage. Therefore, a response time becomes long and the VBB level increases while not maintaining it stably.

That is, even if the level increase of the internal voltage VBB is detected, some time is necessary until an additional supply from the charge pump. Consequently, the level of the internal voltage VBB continues to increase during the necessary time.

As described above, the level of the internal voltage is not maintained stably. Also, if the level of the internal voltage changes depending on the internal operation, noise is generated from the semiconductor memory device using the interval voltage, reducing the operational reliability of the device.

SUMMARY OF THE INVENTION

It is, therefore, an object of the present invention to provide an internal voltage generating circuit for providing a stable internal voltage by supplying the internal voltage before a time point when it is used.

In accordance with an aspect of the present invention, there is provided an internal voltage generating circuit including: a charge pump unit for generating an internal voltage lower than an external voltage in response to pumping control signals and a supply driving control signal; a pumping control signal generating unit for outputting the pumping control signals to the charge pump unit based on a driving signal; and a supply driving control unit for receiving the driving signal to generate the supply driving control signal to the charge pump unit.

In accordance with another aspect of the present invention, there is provided a semiconductor memory device for stably supplying an internal voltage including: a charge pump unit for generating the internal voltage being lower than an external voltage in response to pumping control signals and a supply driving control signal; an oscillator for generating a periodic signal in response to a driving signal, without detecting a level change of the internal voltage; a pumping control signal generating unit for generating the pumping control signals for outputting the pumping control signals to the charge pump unit based on the periodic signal; and a supply driving control unit for receiving the periodic signal to generate the supply driving control signal to the charge pump unit

BRIEF DESCRIPTION OF THE DRAWINGS

The above and other objects and features of the present invention will become apparent from the following description of the preferred embodiments given in conjunction with the accompanying drawings, in which:

FIG. 4B is an operational waveform of the pumping control signal generator shown in FIG. 4A;

DETAILED DESCRIPTION OF THE INVENTION

Other objects and aspects of the invention will become apparent from the following description of the embodiments with reference to the accompanying drawings, which is set forth hereinafter.

Figure 1:
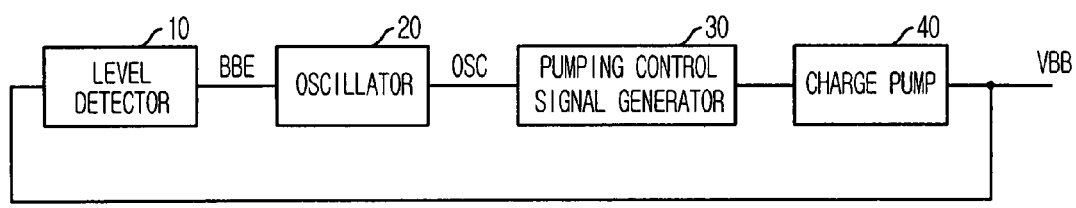
FIG. 1 is a block diagram of a conventional internal voltage generating circuit.
Figure 2:
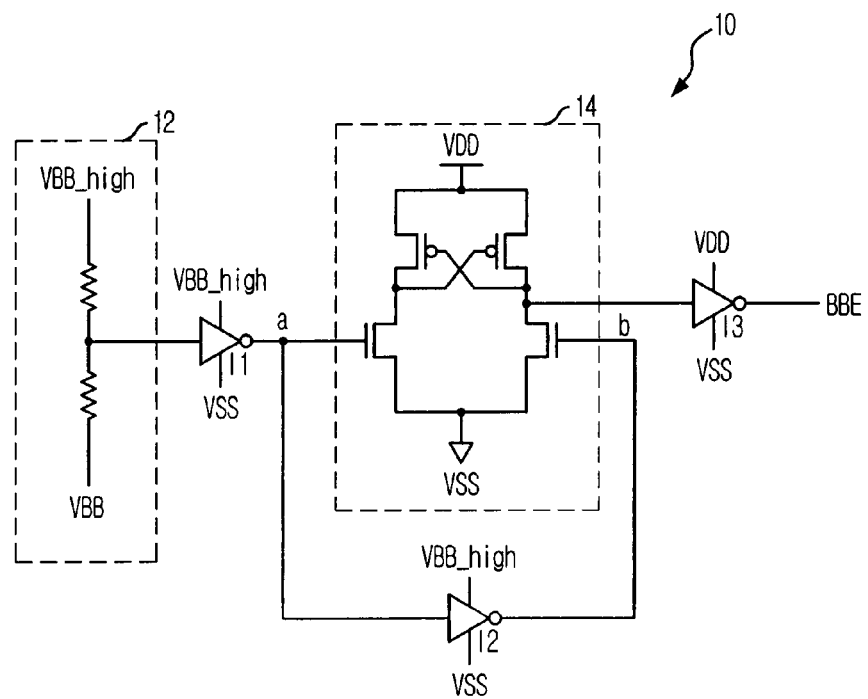
FIG. 2 is a circuit diagram of a level detector shown in FIG. 1.
Figure 3:
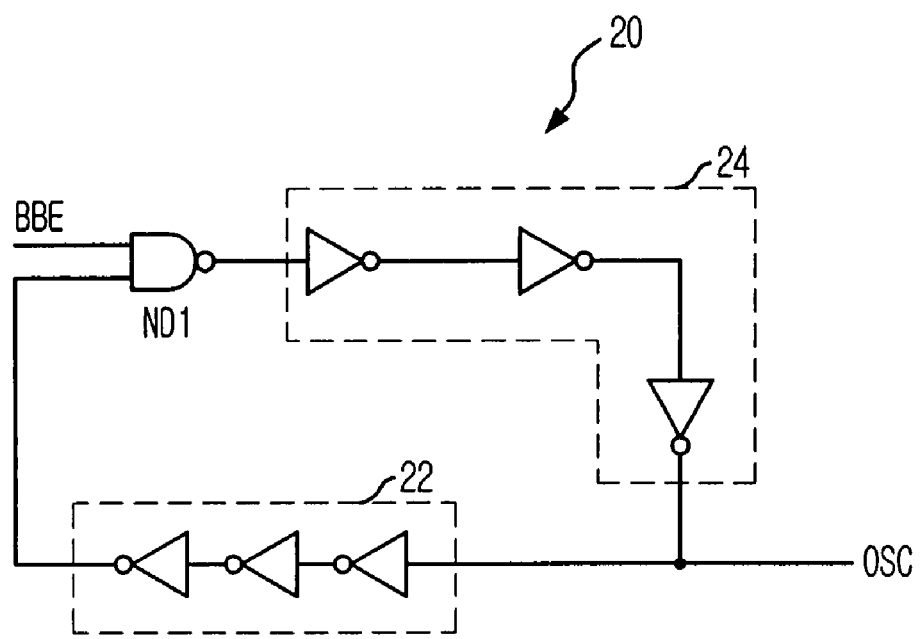
FIG. 3 is a circuit diagram of an oscillator shown in FIG. 1.
Figure 4A:
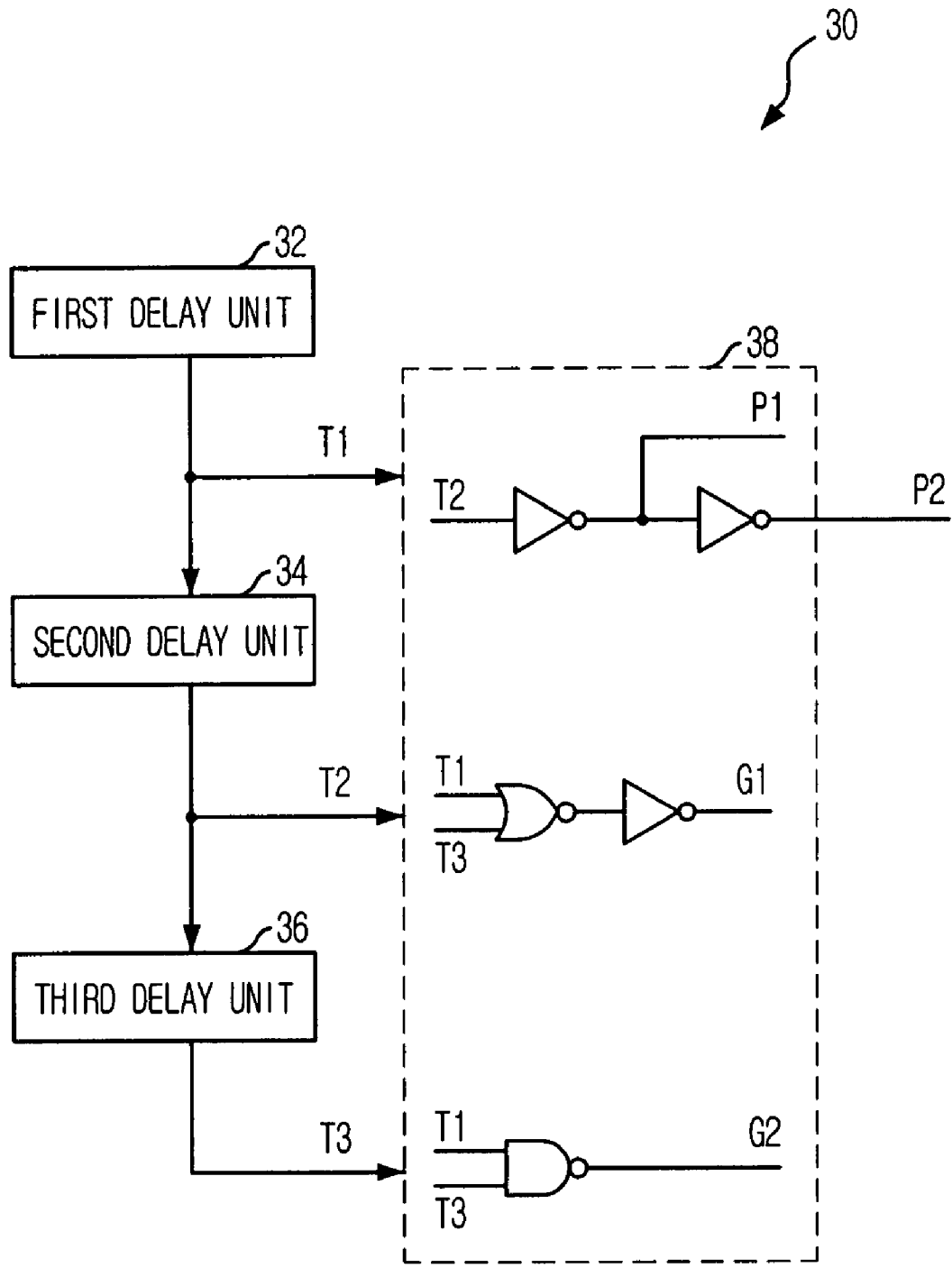
FIG. 4A is a circuit diagram of a pumping control signal generator shown in FIG. 1.
Figure 5:
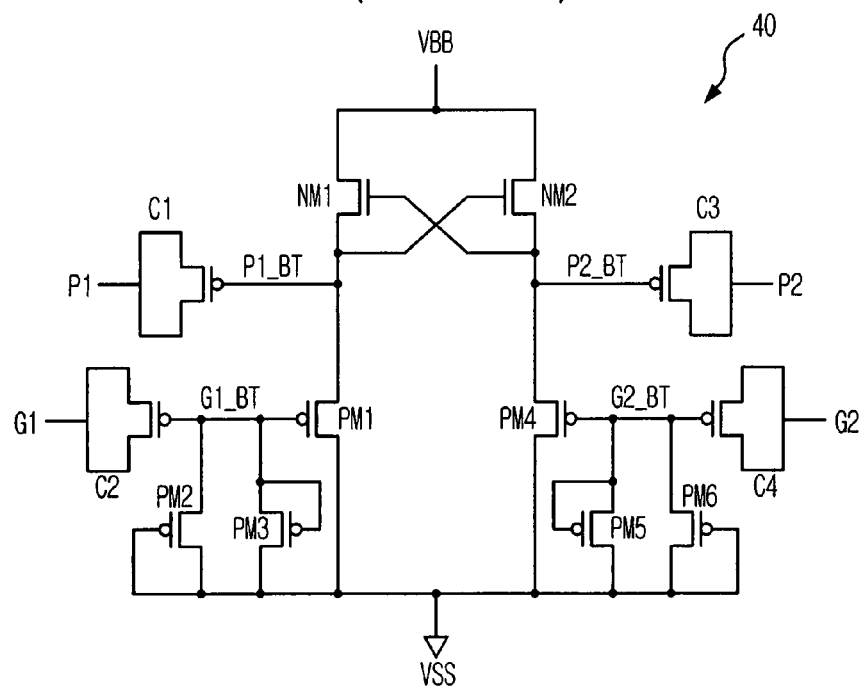
FIG. 5 is a circuit diagram of a charge pump shown in FIG. 1.
Figure 6:
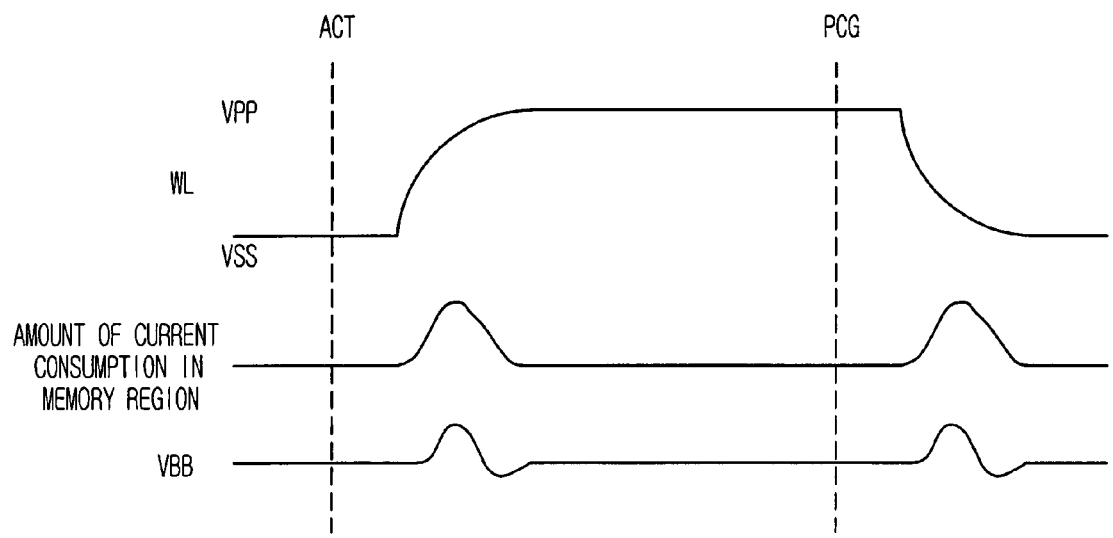
FIG. 6 is a graph for explaining problems of the conventional internal voltage generating circuit.
Figure 7:
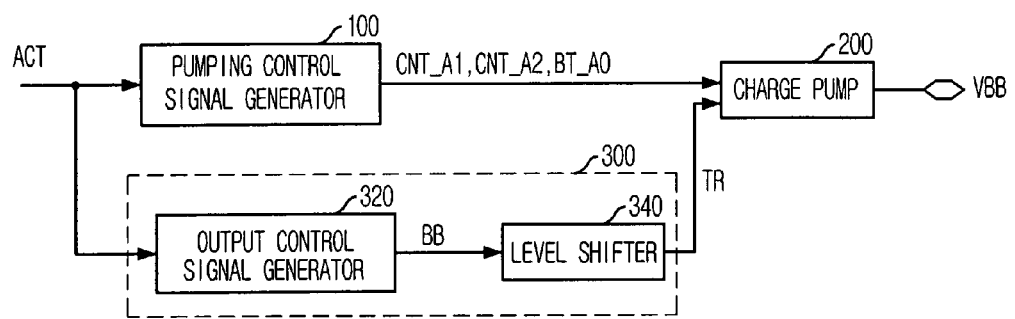
FIG. 7 is a block diagram of an internal voltage generating circuit in accordance with a first embodiment of the present invention.

FIG. 7 is a block diagram of an internal voltage generating circuit in accordance with a first embodiment of the present invention.

Referring to FIG. 7, the internal voltage generating circuit includes a pumping control signal generator 100, a charge pump 200, and a supply driving controller 300.

The charge pump 200 negatively pumps an external voltage VDD to generate an internal voltage VBB lower than the VDD level. The pumping control signal generator 100 generates a plurality of pumping control signals CNT_A1, CNT_A2 and BT_A0 for controlling a driving of the charge pump 200 when an active command ACT is applied. The supply driving controller 300 receives the active command ACT and controls a supply of the internal voltage VBB of the charge pump 200.

The supply driving controller 300 includes an output control signal generator 320 for receiving the active command ACT to generate an output control signal BB, and a level shifter 340 for shifting a level of the output control signal BB.

In this embodiment, the internal voltage generating circuit negatively pumps the external voltage VDD when the active command ACT is applied, and generates the internal voltage VBB.

That is, the internal voltage generating circuit supplies the internal voltage VBB much more in response to the active command ACT, before a large amount of a current is rapidly dissipated in a memory region when the active command ACT is applied. Therefore, the level of the internal voltage VBB can be maintained stably.

Figure 8:
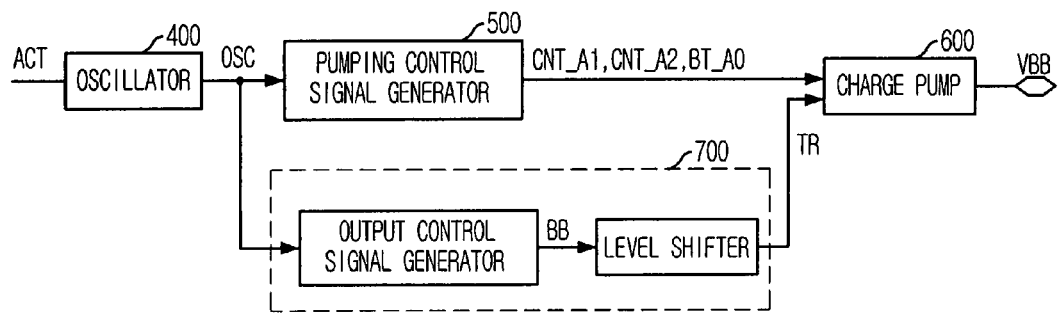
FIG. 8 is a block diagram of an internal voltage generating circuit in accordance with a second embodiment of the present invention.

FIG. 8 is a block diagram of an internal voltage generating circuit in accordance with a second embodiment of the present invention.

Referring to FIG. 8, the internal voltage generating circuit includes an oscillator 400, a pumping control signal generator 500, a charge pump 600, and a supply driving controller 700.

The charge pump 600 negatively pumps an external voltage VDD to generate an internal voltage VBB lower than the VDD level. The oscillator 400 generates a periodic signal OSC in response to an active command ACT. The pumping control signal generator 500 generates a plurality of pumping control signals CNT_A1, CNT_A2 and BT_A0 for controlling a driving of the charge pump 600 in response to the periodic signal OSC. The supply driving controller 700 controls a supply of the internal voltage VBB of the charge pump 600 in response to the periodic signal OSC.

Compared with the first embodiment, the internal voltage generating circuit shown in FIG. 8 further includes the oscillator 400. When the active command ACT is applied, the oscillator 400 generates the periodic signal OSC for a predetermined time. Then pumping control signal generator 500 and the supply driving controller 700 are driven in response to the periodic signal OSC. By controlling the period of the periodic signal OSC and the generating time of the period, the driving time of the charge pump 600 can be controlled.

In the case of the first embodiment, because the charge pump is driven only when the active command ACT is applied, the internal voltage generating circuit in accordance with the first embodiment of the present invention can be used when the drivability is large enough to compensate for the internal current consumption. Also, the internal voltage generating circuit in accordance with the second embodiment of the present invention can be used by controlling the period of the periodic signal OSC according to an amount of the consumed internal voltage VBB and a driving amount of the charge pump 600.

At this point, the active command ACT means a command that causes the elements to consume a large amount of the internal voltage VBB. When the internal voltage generating circuit is used in the semiconductor memory device, the precharge command is also applied. Therefore, the internal voltage generating circuit can also be driven when the precharge command PCG is applied.

In the second embodiment, the only difference from the first embodiment is that the oscillator 400 is further provided. Therefore, the configuration and operation of the internal voltage generating circuit shown in FIG. 7 will be described below.

Figure 9:
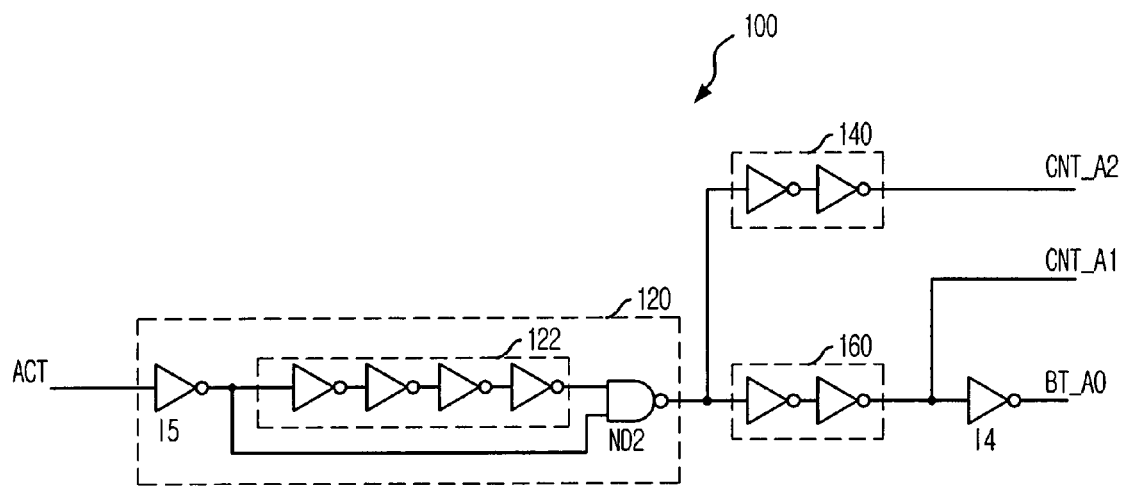
FIG. 9 is a circuit diagram of a pumping control signal generator shown in FIG. 7.

FIG. 9 is a circuit diagram of the pumping control signal generator 100 shown in FIG. 7.

Referring to FIG. 9, the pumping control signal generator 100 includes a pulse width extending unit 120 for extending a pulse width of the active command ACT, a first buffer 140 for buffering an output signal of the pulse width extending unit 120 to generate the pumping control signal CNT_A2, a second buffer 160 for buffing an output signal of the pulse width extending unit 120 to generate the pumping control signal CNT_A1, and an inverter I4 for inverting an output signal of the second inverter I60 to generate the pumping control signal BT_A0.

Also, the pulse width extending unit 120 includes an inverter I5 for inverting the active command ACT, a delay unit 122 for delaying an output signal of the inverter I5, and a NAND gate ND2 receiving the output signals of the inverter I5 and the delay unit 122.

When the active command ACT has a logic high level, the pumping control signal generator 100 outputs the pumping control signals CNT_A1 and CNT_A2 of a logic high level and the pumping control signal BT_A0 of a logic low level.

Meanwhile, when the active command ACT has a logic low level, the pumping control signal generator 100 outputs the pumping control signals CNT_A1 and CNT_A2 of a logic low level and the pumping control signal BT_A0 of a logic high level.

Figure 10:
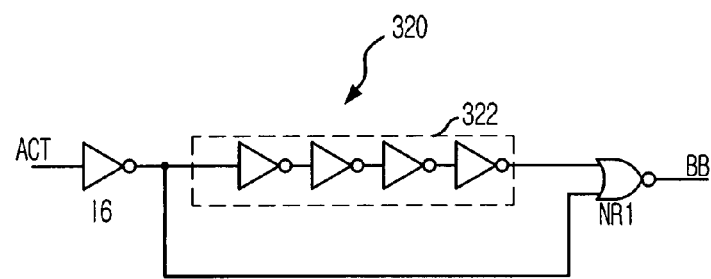
FIG. 10 is a circuit diagram of an output control signal generator shown in FIG. 7.

FIG. 10 is a circuit diagram of the output control signal generator 320.

Referring to FIG. 10, the output control signal generator 320 includes an inverter I6 for inverting the active command ACT, a delay unit 322 for delaying an output signal of the inverter I6, and a NOR gate NR1 for receiving the output signals of the inverter I6 and the delay unit 322 to output the output control signal BB.

When the active command ACT is applied, the output control signal generator 320 generates the output control signal BB of a pulse form, which has an activation period of a logic high level after a delay time of the delay unit 322.

Figure 11:
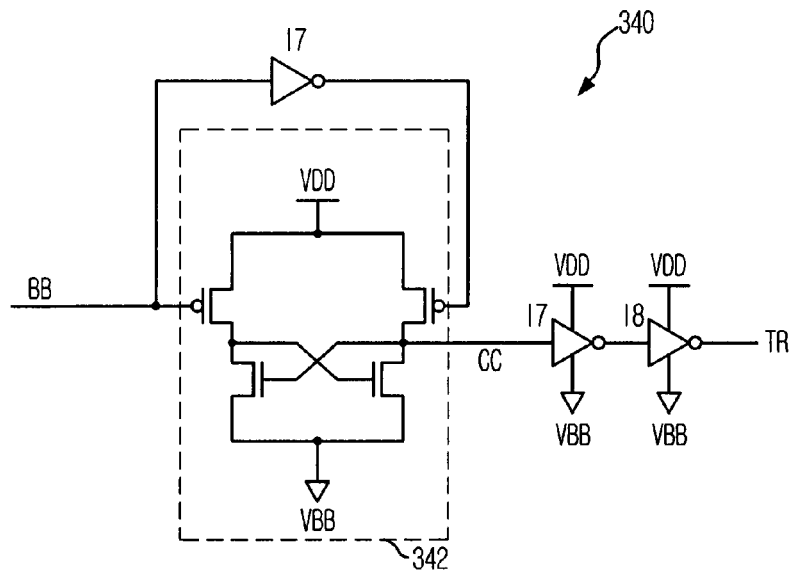
FIG. 11 is a circuit diagram of a level shifter shown in FIG. 7.

FIG. 11 is a circuit diagram of the level shifter 340 shown in FIG. 7.

Referring to FIG. 11, the level shifter 340 includes an inverter I7 for inverting the output control signal BB, a differential amplifier 342 receiving the output control signal and an output signal of the inverter I7, an inverter I7, connected between the external voltage VDD and the internal voltage VBB as the driving voltages, for inverting an output signal of the differential amplifier 342, and an inverter I8 for inverting an output signal of the inverter I7 to output the output driving control signal TR.

The level shifter 340 outputs the output control signal BB swing between the external voltage VDD and the internal voltage VBB.

Figure 12:
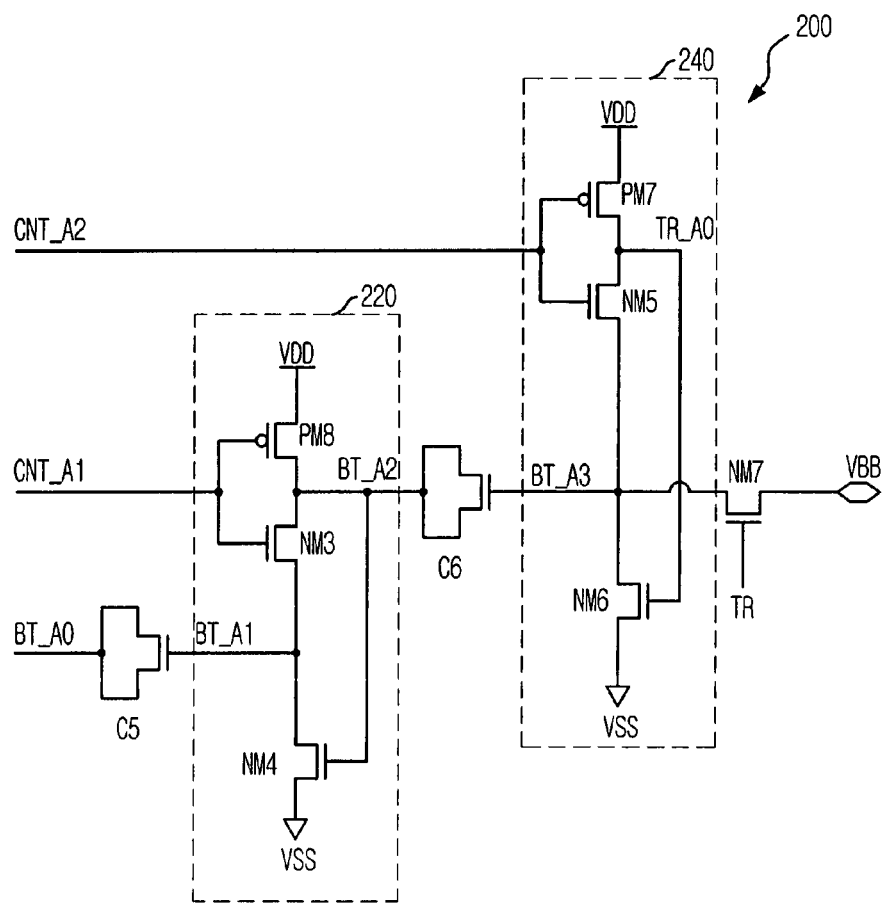
FIG. 12 is a circuit diagram of a charge pump shown in FIG. 7.

FIG. 12 is a circuit diagram of the charge pump 200 shown in FIG. 7.

Referring to FIG. 12, the charge pump 200 includes a first charging unit 220, a first pumping unit C5, a second charging unit 240, a second pumping unit C6, and an NMOS transistor NM7.

The first charging unit 220 charges a node BT_A1 and a node BT_A2 to different levels in response to an activation of the pumping control signal CNT_A1. The first pumping unit C5 pumps the node BT_A1 in response to the pumping control signal BT_A0 activated when the pumping control signal CNT_A1 is deactivated. The second charging unit 240 charges a node TR_A0 and a node BT_A3 to different levels in response to an activation of the pumping control signal CNT_A2. The second pumping unit C6 pumps a node BT_A3 in response to a voltage of the node BT_A2. The NMOS transistor NM7 outputs a voltage of the node BT_A3 as the internal voltage VBB in response to the supply driving control signal TR.

In the first charging unit 220, a PMOS transistor PM8 has a gate receiving the pumping control signal CNT_A1 and a source-drain path between the VDD supply and the node BT_A2. An NMOS transistor NM3 has a gate receiving the pumping control signal CNT_A1 and a drain-source path between the node BT_A2 and the node BT_A1. An NMOS transistor NM4 has a gate receiving the voltage of the node BT_A2 and a drain-source path between the node BT_A1 and the VSS supply.

In the second charging unit 240, a PMOS transistor PM7 has a gate receiving the pumping control signal CNT_A2 and a source-drain path between the VDD supply and the node TR_A0. An NMOS transistor NM5 has a gate receiving the pumping control signal CNT_A2 and a drain-source path between the node TR_A0 and the node TR_A3. An NMOS transistor NM6 has a gate receiving the voltage of the node TR_A0 and a drain-source path between the node BT_A3 and the VSS supply.

The first pumping unit C5 includes a capacitor having one terminal receiving the pumping control signal BT_A0 and the other terminal connected to the node BT_A1. the second pumping unit C6 includes a capacitor connected between the node BT_A2 and the node BT_A3.

An operation of the internal voltage generating circuit in accordance with the first embodiment of the present invention will be described below with reference to FIGS. 9 to 12.

First, when the active command ACT is not activated, the pumping control signal generator 100 outputs the pumping control signals CNT_A1 and CNT_A2 of a logic low level and the pumping control signal BT_A0 of a logic high level.

Accordingly, the PMOS transistors PM8 and PM7 of the charge pump 200 receive the pumping control signals CNT_A1 and CNT_A2 and precharge the nodes BT_A2 and TR_A0 to the VDD level and the nodes BT_A1 and BT_A3 to the VSS level.

Also, since the supply driving controller 300 outputs the supply driving control signal TR of the low VBB level in response to the deactivation of the active command ACT, the NMOS transistor NM7 of the charge pump 200 is turned off. Consequently, the internal voltage VBB is not supplied.

Meanwhile, when the active command ACT is applied, the pumping control signal generator 100 changes the pumping control signals CNT_A1 and CNT_A2 to a logic high level. Thus, the PMOS transistors PM8 and PM7 are turned off and the NMOS transistors NM3 and NM5 are turned on in response to the pumping control signals CNT_A1 and CNT_A2, so that the nodes BT_A2 and TR_A0 are opened from the VDD supply. Then, the NMOS transistors NM4 and NM6 are turned off in response to the voltages of the nodes BT_A2 and TR_A0, so that the nodes BT_A1 and BT_A3 are opened from the VSS supply.

Also, since the pumping control signal BT_A0 changes to a logic low level, the node BT_A1 is set to –VDD level and the node BT_A2 is set to –VDD level through the turned-on NMOS transistor NM3. Accordingly, the capacitor C6 receiving the voltage of the node BT_A2 negatively pumps the node BT_A3, so that the node BT_A3 decreases to –2VDD level.

Since the supply driving controller 300 activates the supply driving control signal TR to a logic high level in response to the active command ACT, the NMOS transistor NM7 of the charge pump 200 is turned on, so that –2VDD voltage applied to the node BT_A3 is supplied as the internal voltage VBB.

In the case of the internal voltage generating circuit in accordance with the second embodiment of the present invention, if the active command ACT is not applied, the oscillator 400 deactivates the periodic signal OSC to a logic low level. Thus, the pumping control signal generator 500, the supply driving controller 700, and the charge pump 600 are deactivated. When the active command ACT is applied, the oscillator 400 activates the periodic signal OSC to a logic high level. Therefore, the charge pump 600 outputs the internal voltage VBB by negatively pumping the external voltage VDD in response to the control signals CNT_A1, CNT_A2 and BT_A0 outputted from the activated pumping control signal generator 500 and the activated supply driving controller 700.

In the above operation, it is assumed that a threshold voltage of the MOS transistors is Vt.

Figure 13:
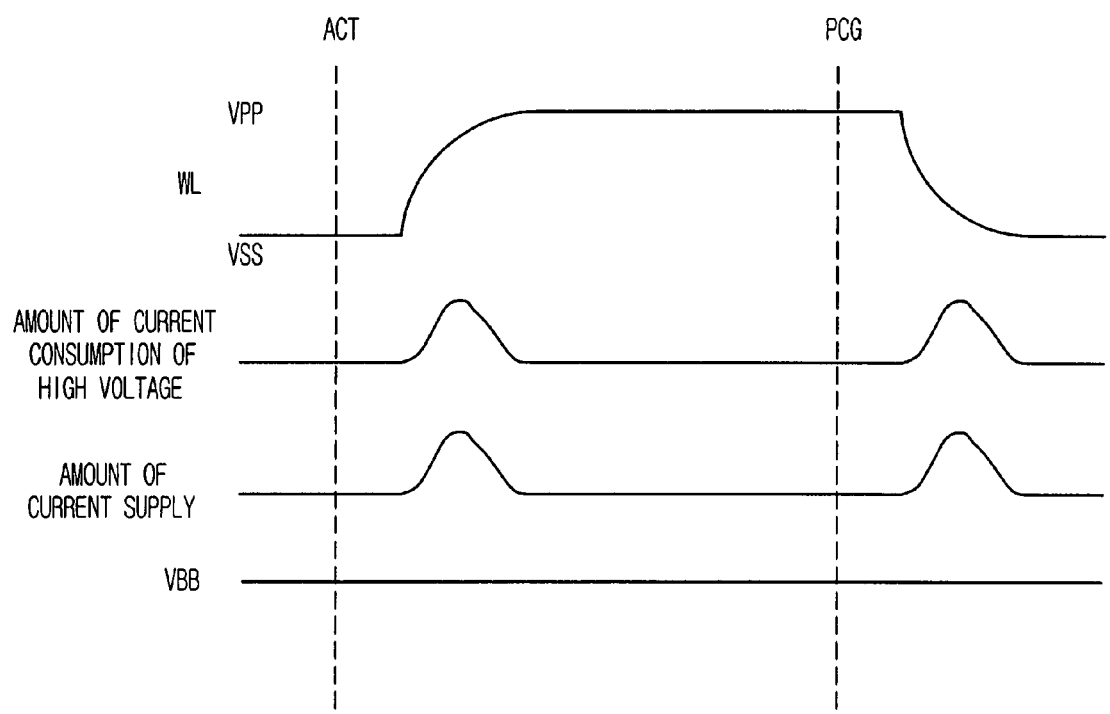
FIG. 13 is an operational waveform of the internal voltage generating circuit shown in FIG. 7.

FIG. 13 is an operational waveform of the internal voltage generating circuit shown in FIG. 7.

Referring to FIG. 13, a large of a current is dissipated in a memory region at a time point when a word line (WL) is activated by the active command ACT, and a time point when a word line (WL) is deactivated by a precharge command PCG.

As described above, since the internal voltage VBB is supplied at the large drivability, the level of the internal voltage VBB can be stably maintained.

Therefore, the internal voltage generating circuit supplies in advance the internal voltage at the large drivability when applying the command causing a large current consumption inside the device. Thus, even when the current is substantially consumed by the command, the level of the internal voltage can be stably maintained. Unlike the prior art in which the internal voltage is supplied after the detection of the level decrease, an amount of a current supply is previously increased before the current is consumed, thus reducing the response time.

In addition, compared with the prior art, the internal voltage generating circuit in accordance with the present invention occupies a smaller area.

In the above embodiments, the active command is exemplarily described because the semiconductor memory device using the internal voltage generating circuit consumes a large amount of a current when the active command is applied. That is, other driving signals expected to consume a large amount of a current can be applied instead of the active command. Therefore, the present invention is not limited by the driving signal for driving the internal voltage generating circuit.

As described above, before a large amount of a current is consumed by the command, an amount of a current supply is increased. Therefore, the response time is reduced to thereby maintain a high voltage level stably. In addition, the occupied area can be reduced.

The present application contains subject matter related to Korean patent application No. 2005-36549, filed in the Korean Intellectual Property Office on Apr. 30, 2005, the entire contents of which is incorporated herein by reference.

While the present invention has been described with respect to certain preferred embodiments, it will be apparent to those skilled in the art that various changes and modifications may be made without departing from the scope of the invention as defined in the following claims.

What is claimed is:

1. An internal voltage generating circuit, comprising:
a charge pump unit for generating an internal voltage lower than an external voltage in response to a plurality of pumping control signals and a supply driving control signal;
a pumping control signal generating unit for generating the pumping control signals to the charge pump unit based on an active command causing large current consumption of the internal voltage within an external device; and
a supply driving control signal generating unit for generating the supply driving control signal to the charge pump unit based on the active command.

2. The internal voltage generating circuit as recited in claim 1, wherein the charge pump unit includes:
a first charging unit for charging a first node and a second node to different levels in response to an activation of a first pumping control signal;
a first pumping unit for pumping the first node in response to a second pumping control signal;
a second charging unit for charging a third node and a fourth node to different levels in response to an activation of a third pumping control signal;
a second pumping unit for pumping the fourth node in response to a voltage of the second node; and
a first NMOS transistor for outputting a voltage of the fourth node as the internal voltage in response to the supply driving control signal.

3. The internal voltage generating circuit as recited in claim 2, wherein the first charging unit includes:
a first PMOS transistor having a gate receiving the first pumping control signal and a source-drain path between an external voltage supply and the second node;
a second NMOS transistor having a gate receiving the first pumping control signal and a drain-source path between the second node and the first node; and
a third NMOS transistor having a gate receiving a voltage of the second node and a drain-source path between the first node and a ground voltage supply.

4. The internal voltage generating circuit as recited in claim 2, wherein the second charging unit includes:
a first PMOS transistor having a gate receiving the second pumping control signal and a source-drain path between an external voltage supply and the third node;
a second NMOS transistor having a gate receiving the second pumping control signal and a drain-source path between the third node and the fourth node; and
a third NMOS transistor having a gate receiving a voltage of the third node and a drain-source path between the fourth node and a ground voltage supply.

5. The internal voltage generating circuit as recited in claim 2, wherein the first pumping unit includes a first capacitor having one terminal receiving the second pumping control signal and the other terminal connected to the first node, and the second pumping unit includes a second capacitor connected between the second node and the fourth node.

6. The internal voltage generating circuit as recited in claim 2, wherein the pumping control signal generating unit includes:
a pulse width extending unit for extending a pulse width of an input signal thereof;
a first buffer for buffering an output signal of the pulse width extending unit to output the first pumping control signal;
a first inverter for inverting an output signal of the first buffer to output the second pumping control signal; and
a second buffer for buffering the output signal of the pulse width extending unit to output the third pumping control signal.

7. The internal voltage generating circuit as recited in claim 6, wherein the pulse width extending unit includes:
a second inverter for inverting an input signal thereof;
a delay unit for delaying an output signal of the second inverter; and
a NAND gate for receiving the output signal of the second inverter and an output signal of the delay unit.

8. The internal voltage generating circuit as recited in claim 2, wherein the supply driving control signal generating unit includes:
an output control signal generator for outputting its input signal as an output control signal for controlling an output time point of the charge pump unit; and
a level shifter for shifting a level of the output control signal to output the supply driving control signal swing between the external voltage and the internal voltage.

9. The internal voltage generating circuit as recited in claim 8, wherein the output control signal generator includes:
an inverter for inverting an input signal thereof;
a delay unit for delaying an output signal of the inverter; and a NOR gate for receiving the output signal of the inverter and an output signal of the delay unit to output the output control signal.

10. The internal voltage generating circuit as recited in claim 8, wherein the level shifter includes:
   a first inverter for inverting the output control signal;
   a differential amplifier for receiving the output control signal and an output signal of the first inverter;
   a second inverter configured to receive the external voltage and the internal voltage as driving voltages, for delaying an output voltage of the differential amplifier; and
   a third inverter configured to receive the external voltage and the internal voltage as driving voltages, for delaying an output signal of the second inverter to output the supply driving control signal.

11. A semiconductor memory device, comprising:
   a charge pump unit for generating an internal voltage lower than an external voltage in response to a plurality of pumping control signals and a supply driving control signal;
   an oscillator for generating a periodic signal in response to an active command without detecting a level change of the internal voltage, the active command causing large current consumption of the internal voltage within an external device;
   a pumping control signal generating unit for generating the pumping control signals to the charge pump unit based on the periodic signal; and
   a supply driving control generating unit for generating the supply driving control signal to the charge pump unit based on the periodic signal.

12. The semiconductor memory device as recited in claim 11, wherein the charge pump unit includes:
   a first charging unit for charging a first node and a second node to different levels in response to an activation of a first pumping control signal;
   a first pumping unit for pumping the first node in response to a second pumping control signal;
   a second charging unit for charging a third node and a fourth node to different levels in response to an activation of a third pumping control signal;
   a second pumping unit for pumping the fourth node in response to a voltage of the second node; and
   a first NMOS transistor for outputting a voltage of the fourth node as the internal voltage in response to the supply driving control signal.

13. The semiconductor memory device as recited in claim 12, wherein the first pumping unit includes a first capacitor having one terminal receiving the second pumping control signal and the other terminal connected to the first node, and the second pumping unit includes a second capacitor connected between the second node and the fourth node.

14. The semiconductor memory device as recited in claim 12, wherein the pumping control signal generating unit includes:
   a pulse width extending unit for extending a pulse width of an input signal thereof;
   a first buffer for buffering an output signal of the pulse width extending unit to output the first pumping control signal;
   a first inverter for inverting an output signal of the first buffer to output the second pumping control signal; and
   a second buffer for buffering the output signal of the pulse width extending unit to output the third pumping control signal.

15. The semiconductor memory device as recited in claim 14, wherein the pulse width extending unit includes:
   a second inverter for inverting an input signal thereof;
   a delay unit for delaying an output signal of the second inverter; and
   a NAND gate for receiving the output signal of the second inverter and an output signal of the delay unit.

16. The semiconductor memory device as recited in claim 12, wherein the supply driving control generating unit includes:
   an output control signal generator for outputting its input signal as an output control signal for controlling an output time point of the charge pump unit; and
   a level shifter for shifting a level of the output control signal to output the supply driving control signal swing between the external voltage and the internal voltage.

17. The semiconductor memory device as recited in claim 16, wherein the output control signal generator includes:
   a inverter for inverting an input signal thereof;
   a delay unit for delaying an output signal of the inverter; and
   a NOR gate for receiving the output signal of the inverter and an output signal of the delay unit to output the output control signal.

18. The semiconductor memory device as recited in claim 16, wherein the level shifter includes:
   a first inverter for inverting the output control signal;
   a differential amplifier for receiving the output control signal and an output signal of the first inverter;
   a second inverter configured to receive the external voltage and the internal voltage as driving voltages, for delaying an output voltage of the differential amplifier; and
   a third inverter configured to receive the external voltage and the internal voltage as driving voltages, for delaying an output signal of the second inverter to output the supply driving control signal.

* * * * *